United States Patent [19]

Sugibayashi

[11] Patent Number: 5,848,021

[45] Date of Patent: Dec. 8, 1998

[54] SEMICONDUCTOR MEMORY DEVICE HAVING MAIN WORD DECODER SKIPPING DEFECTIVE ADDRESS DURING SEQUENTIAL ACCESS AND METHOD OF CONTROLLING THEREOF

[75] Inventor: Tadahiko Sugibayashi, Tokyo, Japan

[73] Assignee: NEC Corporation, Tokyo, Japan

[21] Appl. No.: 966,478

[22] Filed: Nov. 7, 1997

[30] Foreign Application Priority Data

Nov. 8, 1996 [JP] Japan .................................... 8-296322

[51] Int. Cl.⁶ ................................................... G11C 8/00
[52] U.S. Cl. .................... 365/230.06; 365/200; 365/201; 365/230.03; 365/240; 365/230.08; 365/225.7; 365/236
[58] Field of Search ..................... 365/200, 201, 365/230.06, 230.03, 240, 230.08, 225.7, 236

[56] References Cited

U.S. PATENT DOCUMENTS 5,661,689 8/1997 Shinkai ................................ 365/200

5,745,415 4/1998 Marr ...................................... 365/201

FOREIGN PATENT DOCUMENTS 4-369750 12/1992 Japan .
8-102529 4/1996 Japan .

*Primary Examiner*—David Nelms
*Assistant Examiner*—Andrew Q. Tran
*Attorney, Agent, or Firm*—Sughrue, Mion, Zinn, Macpeak & Seas, PLLC

[57] ABSTRACT

A semiconductor memory device has a main word decoder for selecting a cluster from a memory cell block, and the main word decoder stores pieces of control data information each representative of whether the cluster is defective or non-defective; while an external device is sequentially accessing the clusters, the main word decoder skips the defective clusters on the basis of the piece of control data information, and accelerates the data access to the clusters.

8 Claims, 11 Drawing Sheets

SEMICONDUCTOR MEMORY DEVICE HAVING MAIN WORD DECODER SKIPPING DEFECTIVE ADDRESS DURING SEQUENTIAL ACCESS AND METHOD OF CONTROLLING THEREOF

FIELD OF THE INVENTION

This invention relates to a semiconductor memory device and, more particularly, to a semiconductor memory device having a main word decoder skipping defective address during a sequential access and a method of controlling thereof.

DESCRIPTION OF THE RELATED ART

A high-speed data file apparatus is implemented by semiconductor dynamic random access memory devices instead of a hard disk unit, and the semiconductor dynamic random access memory devices provide an address space for storing pieces of data information. The semiconductor random access memory devices are not expected to form an excellent address space, because a file allocation table skips the address assigned to a defective sector or a defective cluster.

A typical example of the semiconductor dynamic random access memory device is disclosed in Japanese Patent Publication of Unexamined Application No. 8-102529. Japanese Patent Application No. 6-259590 was filed by NEC Corporation, i.e., the assignee of the present application, and was published as the Japanese Patent Publication of Unexamined Application. In the following description, an address assigned to a defective word or a defective cluster is referred to as "defective address".

FIG. 1 illustrates the address space 1 created by the prior art semiconductor dynamic random access memory device. In the address space 1, 256 sectors form each cluster 2, and addresses are assigned to the clusters 2. The address space 1 further contains a file allocation table 3, and the file allocation table 3 stores defective addresses or the addresses assigned to defective clusters 4.

Main word line pairs 5 are associated with the address space 1, and main word line pairs 5 make the clusters 2 selectively accessed. When an central processing unit (not shown) supplies an external address to the prior art semiconductor dynamic random access memory device, the prior art semiconductor dynamic random access memory device checks the file allocation table 3 to see whether or not the external address is matched with one of the defective addresses stored therein. If the address is not stored in the file allocation table 3, the prior art semiconductor dynamic random access memory device allows the central processing unit to access data stored in the selected cluster 2, and a main word decoder 6 selectively drives the main word line pairs 5.

The prior art semiconductor dynamic random access memory device loses the addresses stored in the file allocation table 3 upon power-off. In order to store the defective addresses, a fuse circuit is incorporated in the main word decoder 6.

FIG. 2 illustrates a main word decoder circuit of the word line decoder associated with a main word line pair MWL/MWLB, and the main word line pair MWL/MWLB activates a cluster through a sub-word decoder 6a. The fuse circuit is implemented by fuse elements 6b, and the fuse elements 6b are associated with the clusters 2/4, respectively. When the clusters 4 are diagnosed to be defective, the associated fuse elements 6b are broken, and, thereafter, the prior art semiconductor dynamic random access memory device is installed in an electronic system. When the electronic system is powered, the prior art semiconductor dynamic random access memory device carries out a roll-call test so as to read out the pieces of defective address information from the fuse circuit 6, and determines the defective addresses of the defective clusters 4. The defective addresses are written into the file allocation table 3. The defective addresses are always stored in the file allocation table 3 after the roll-call test, and the prior art semiconductor dynamic random access memory device checks the file allocation table 3 to see whether or not the cluster 2/4 specified by the external address BSL/ADD is used as data storage. Thus, the file allocation table 3 rescues the excellent clusters 2 from rejection together with the defective clusters 4. However, the file allocation table 3 is checked before the data access, and the access time is prolonged. This results in reduction of the data transfer rate. If the data to be read out is stored in clusters 2 assigned a series of addresses, the prior art semiconductor dynamic random access memory device allows an central processing unit to successively access the data without checking the file allocation table 3. Nevertheless, the addresses are usually discrete, and the file allocation table 3 is checked before each data access.

The prior art main word line driver circuit behaves as follow. If the fuse element 6b remains unbroken, the inverter 6c supplies low voltage level to the node 6d at all times, and the AND gate 6e supplies low voltage level to the NOR gate 6f. The NOR gate 6f is enabled with the low voltage level. The node 6d is connected to the gate electrode of the n-channel enhancement type field effect transistor 6g, and the n-channel enhancement type field effect transistors 6g/6h controls the potential level on the roll-call line RCX.

In this situation, when the block address signal BSL, the cluster address signal ADD and the row address signal RA1 specify the main word line pair MWL/MWLB, the NAND gate 6i and the inverter 6j change the respective output signals to the low voltage level, and the NOR gate 6k yields the output signal of the high voltage level. The output signal of the NOR gate 6k is supplied to the series of inverters 6m/6n and the NOR gate 6f. The inverter 6n drives the main word line MWL to boosted voltage level VBOOT, and the NOR gate 6f falls the main word line MWLB to the low voltage level. The main word line MWL and the n-channel enhancement type field effect transistor 6o propagate the boosted voltage level VBOOT to the gate electrode of the n-channel enhancement type field effect transistor 6p, and the main word line MWLB gates the n-channel enhancement type field effect transistor 6q with the low voltage level. The n-channel enhancement type field effect transistor 6p turns on, and the other n-channel enhancement type field effect transistor 6q turns off. Then, the row address signal RA1 of the boosted voltage level RA1 is transferred to the sub-word line SWL, and the memory cell 6r produces a potential difference on the bit line pair BL/CBL. The sense amplifier 6s develops the potential difference.

On the other hand, if the fuse element 6b is to be broken, the inverter 6c supplies the high voltage level to the node 6d, and the n-channel enhancement type field effect transistor 6t turns on so as to fix the node 6d to the high voltage level. The file allocation table 3 does not allow the cluster address signal ADD to specify the main word line pairs MWL/MWLB, and the NAND gate 6i fixes the output signal to the high voltage level. The NOR gate 6k fixes the output signal to the low voltage level, and the inverters 6m/6n keep the main word line MWL in the inactive low voltage level. As a result, the sub-word line SWL is never driven to the active boosted voltage level VBOOT. In this situation, when the block address signal BSL specifies another memory cell block (not shown), the inverter 6j yields the output signal of the high voltage level, and the AND gate 6e supplies the output signal of the high voltage level to the NOR gate 6f. The NOR gate 6f is disabled, and fixes the main word line MWLB to the inactive low level. On the other hand, if the block address signal BSL specifies the memory cell block containing the memory cell 6r, inverter 6j yields the output signal of the low voltage level, and the AND gate 6e changes the output signal to the low voltage level. The NOR gate 6f is enabled with the output signal of the AND gate 6e, and changes the main word line MWLB to the high voltage level. The main word line MWLB causes the n-channel enhancement type field effect transistor 6q to turn on, and the sub-word line SWL is grounded through the n-channel enhancement type field effect transistor 6q. The grounded sub-word line SWL does not have undesirable influence on the other sub-word lines of the same memory cell block.

Another data file apparatus is disclosed in Japanese Patent Publication of Unexamined Application No. 4-369750, and is shown in FIG. 3. The prior art data file apparatus includes semiconductor memory devices 7a/7b/7c and a controller 7d connected between the semiconductor memory devices 7a/7b/7c and a central processing unit 8. Read only memory units 7e/7f/7g are respectively incorporated in the semiconductor memory devices 7a to 7c, and defective addresses are stored in the read only memory units 7e/7f/7g. The controller 7d includes a memory unit 7h and an address converter 7j. The defective addresses are firstly transferred from the read only memory units 7e/7f/7g to the memory unit 7h, and are stored therein. The address converter 7j stores addresses of the semiconductor memory devices 7a to 7c with which the defective addresses have been replaced. Assuming now that the central processing unit 8 supplies an external address to the controller 7d, the controller 7d checks the memory unit 7h to see whether or not the external address is matched with one of the defective addresses. If the external address is not matched with the defective addresses, the controller 7d transfers the external address to the semiconductor memory devices 7a to 7c, and the data is read out from the memory location of the semiconductor memory devices 7a to 7c specified with the external address. On the other hand, if the external address is matched with a defective address, the external address is transferred to the address converter 7j, and the external address is converted to the certain address of the excellent memory location. The controller 7d supplies the certain address to the semiconductor memory devices 7a to 7c, and data is read out from the memory location of the semiconductor memory devices 7a to 7c specified with the certain address.

Thus, the file allocation memory 3 and the controller 7d rescue defective semiconductor memory devices from rejection. However, the prior art semiconductor memory device with the file allocation table 3 encounters a problem in long access time. Moreover, the defective clusters sometimes does not allow the central processing unit to successively access the data without checking the file allocation table 3.

The controller 7d improves the data access time, because the address directly selects a memory location from the semiconductor memory devices 7a to 7c. However, the prior art data file apparatus shown in FIG. 3 requires the external memory unit 7h for storing defective addresses. The external memory unit 7h is costly. Although defective products are available for the semiconductor memory devices 7a to 7c, the production cost is not reduced due to the costly external memory unit 7h.

SUMMARY OF THE INVENTION

It is therefore an important object of the present invention to provide a high-speed low-cost semiconductor memory device.

It is also an important object of the present invention to provide a method for controlling the high-speed low-cost semiconductor memory device.

In accordance with one aspect of the present invention, there is provided a semiconductor memory device for skipping defective word lines comprising a defective word line discriminating means respectively incorporated in row decoders for producing binary signals representative of the defective word lines, and a converting means responsive to the binary signals for converting external logical addresses assigned to non-defective word lines to addresses lower than the external logical addresses.

In accordance with another aspect of the present invention, there is provided a semiconductor memory device comprising a plurality of memory cells divided into a plurality of memory groups respectively assigned physical addresses, at least one defective memory group being incorporated in the plurality of memory groups, a decoder including a plurality of decoder units respectively corresponding to the plurality of memory groups, and the plurality of decoder units include a plurality of memory units respectively storing pieces of control data information each representative of whether the associated memory cell group is defective or non-defective and producing first control signals representative of the pieces of control data information, respectively, a plurality of driver units respectively connected to the plurality of memory cell groups and responsive to second control signals for making non-defective memory cell groups accessible, and an address converter connected between the plurality of memory units and the plurality of driver units, responsive to a third control signals for converting external logical addresses indicative of the non-defective memory groups to the physical addresses assigned to the non-defective memory groups specified by the first control signals and selectively supplying the second control signals to the plurality of driver units, and a decoder controller supplying the third control signal to the address converter.

In accordance with yet another aspect of the present invention, there is provided a method for controlling a semiconductor memory device having a plurality of memory cell groups respectively assigned physical addresses comprising the steps of a) counting defective memory cell groups of the plurality of memory cell groups after the semiconductor memory device is powered, b) determining the maximum logical address assigned to one of non-defective memory cell groups of the plurality of memory cell groups on the basis of the number of defective memory cell groups, c) supplying a piece of control data information representative of the maximum logical address to the outside of the semiconductor memory device, and d) entering into a standard mode where an external device selectively accesses the non-defective memory cell groups with a logical address.

BRIEF DESCRIPTION OF THE DRAWINGS

The features and advantages of the semiconductor memory device and the method will be more clearly understood from the following description taken in conjunction with the accompanying drawings in which.

LOGICAL ADDRESS ASSIGNMENT

Figure 1:
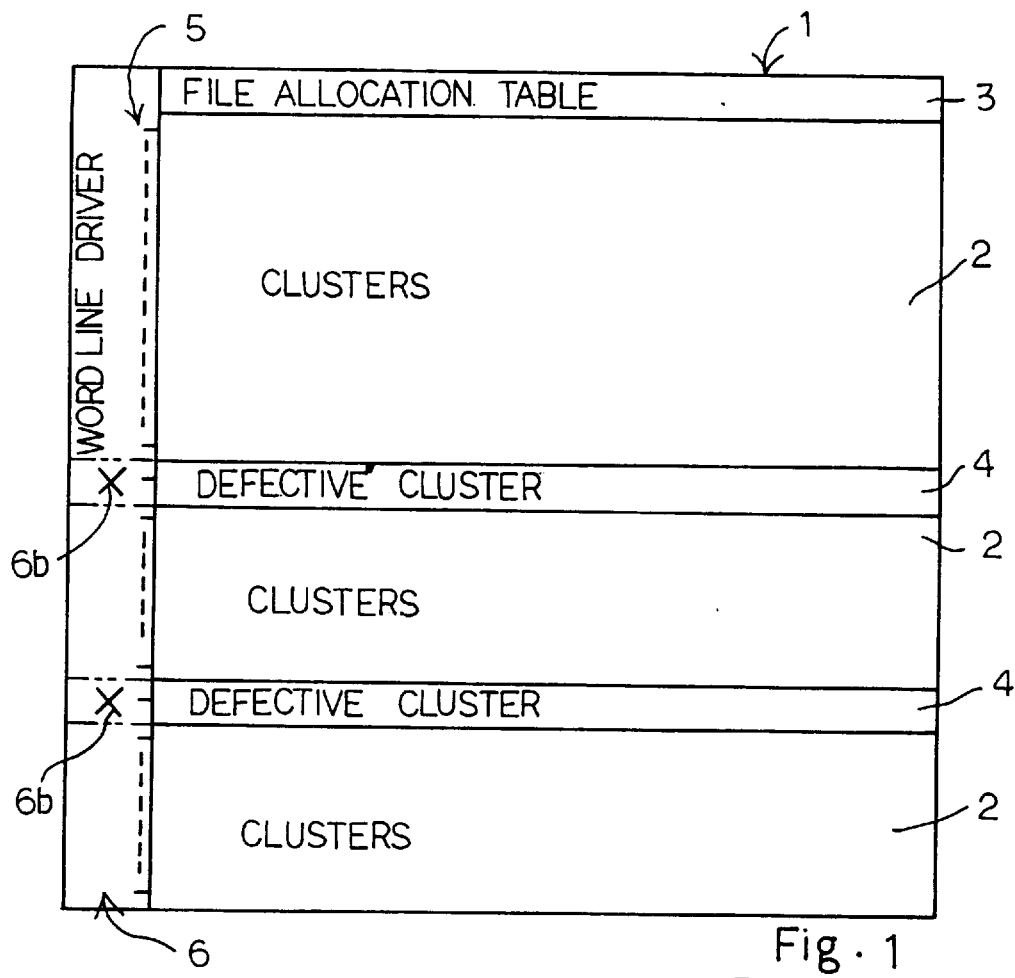
FIG. 1 is a view showing the address space created by the prior art semiconductor dynamic random access memory device.

Firstly, description is made on the address conversion between physical cluster addresses and logical cluster addresses. A semiconductor memory device 10 according to the present invention is assumed to have (N+1) clusters, and physical cluster addresses "0" to "N" are respectively assigned to the (N+1) clusters. The clusters 10a assigned the physical cluster addresses "3" and "7" are defective, and the other clusters 10b are non-defective. Thus, two defective clusters 10a are mixed into the non-defective clusters 10b.

The semiconductor memory device 10 further comprises a main word line driver 10c and word line pairs 10c connected between the main word line driver 10c and the clusters 10a/10b. The main word line driver 10c assigns logical cluster addresses "0" to "N-2" to the non-defective clusters 10b. In other words, the logical cluster address skips the defective clusters 10a, and the logical cluster addresses are inconsistent with the physical cluster addresses after the first defective cluster 10a. In this instance, the physical cluster addresses "0", "1" and "2" are consistent with the logical cluster addresses "0", "1" and "2". Any logical cluster address is not assigned to the defective cluster 10a with the physical cluster address "3". The logical cluster addresses "3" to "5" are respectively assigned to the non-defective clusters with the physical cluster addresses "4" to "6", and any logical cluster address is not assigned to the defective cluster 10a with the physical cluster address "7". The logical cluster addresses "6" to "N-2" are respectively assigned to the non-defective clusters 10b with the physical cluster addresses "8" to "N". Thus, the logical cluster addresses "0" to "N-2" are sequentially assigned to the non-defective clusters 10b.

When the logical cluster addresses are supplied from the outside of the semiconductor memory device, the semiconductor memory device converts the logical cluster addresses to the physical cluster addresses, and allows an external device to selectively access the non-defective clusters.

DESCRTPTTON OF THE PREFERRED EMBODIMENTS

First Embodiment

Figure 5:
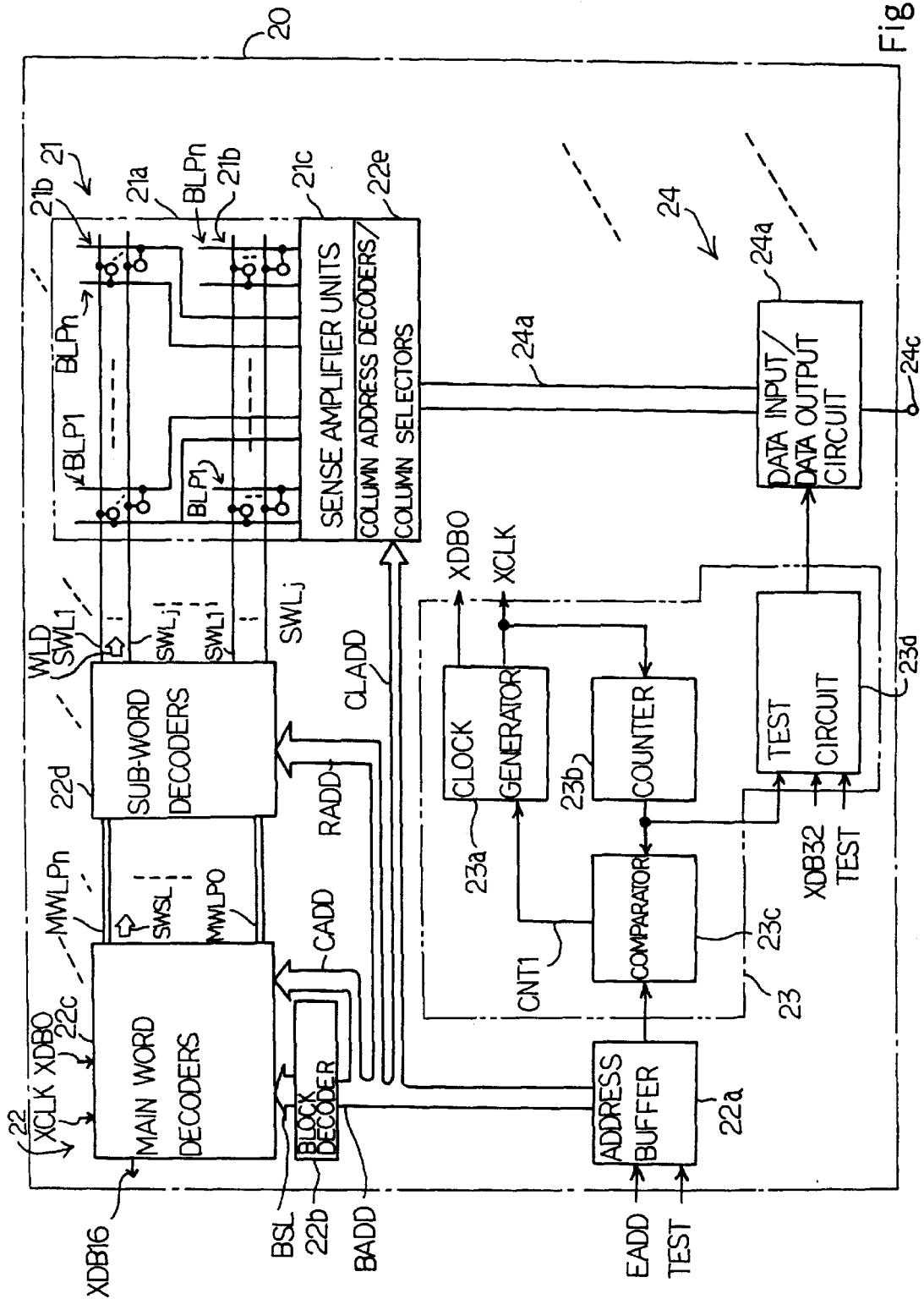
FIG. 5 is a block diagram showing the arrangement of a semiconductor memory device according to the present invention.

Referring to FIG. 5 of the drawings, a semiconductor dynamic random access memory device embodying the present invention largely is fabricated on a semiconductor chip 20, and largely comprises a memory cell array 21, an addressing system 22, a decoder controller 23, and a data interface 24. The memory cell array 21 is divided into a plurality of memory cell blocks 21a, and one of the memory cell blocks 21a is shown in FIG. 5. The memory cell block 21a contains a plurality of memory cells each represented by small bubbles. The memory cells are arranged in rows and columns, and the memory cells in each column are connected to associated one of bit line pairs BLP1/ . . . /BLPn. The memory cell block 21a is divided into a plurality of clusters 21b, and a plurality of rows of memory cells form in combination each cluster 21b as will be described hereinbelow in detail. Sense amplifiers 21c are connected to the bit line pairs BLP1 to BLPn of each memory cell block 21a, and develop potential differences representative of data bits.

The addressing system 22 includes an address buffer 22a, a block decoder 22b connected to the address buffer 22a, main word decoders 22c connected to the address buffer 22a and the block decoder 22b, sub-word decoders 22c connected to the main word decoder 22c and the address buffer 22a and a column address decoder/column selector 22d connected between the bit line pairs BLP1 to BLPn and a data bus 24a. The address buffer 22a receives an external address signal EADD, and produces block address predecoded signals BADD, cluster address predecoded signals CADD, row address predecoded signals RADD and column address predecoded signals CLADD. The main word decoders 22c are respectively associated with the memory cell blocks, and each main word decoder 22c is accompanied with a predetermined number of sub-word decoders 22d. The plurality of sub-word decoders 22d are respectively associated with the clusters. The block address predecoded signals BADD are supplied to the block decoder 22b, and produces a block selecting signal BSL indicative of one of the main word decoders 22c. The cluster address predecoded signals CADD are supplied to the main word decoders 22c, and one of the main word decoders 22c specified by the block selecting signal BSL produces a sub-word decoder selecting signal SWSL. The row address predecoded signals RADD are supplied to the sub-word decoders 22d, and one of the sub-word decoders 22d specified by the block selecting signal BSL and the sub-word decoder selecting signal SWSL produces a word line driving signal WLD indicative of one of the rows of memory cells. The column address predecoded signals CLADD are supplied to the column address decoder/column selector 22e, and the column address decoder/column selector 22e selectively connects the bit line pairs BLP1 to BLPn to the data bus 24a.

The addressing system 22 further includes a plurality of sets of main word line pairs MWLP0 to MWLPn, and each set of main word line pairs MWLP0 to MWLPn is connected between one of the main word decoders 22c and the set of sub-word decoders 22d associated therewith. Each main word line pair MWLP0/MWLPn activates one of the sub-word decoders 22d, and each sub-word decoder 22d is associated with one of the clusters 21b. For this reason, the main word decoder 22c selects a cluster from the associated memory cell block 21a.

The addressing system 22 further includes a plurality of sets of sub-word lines SWL1 to SWLj respectively connected to the sub-word decoders 22d associated with one of the main word decoders 22c. Each set of sub-word lines SWL1 to SWLj is associated with one of the clusters 21b, and the sub-word lines SWL1 to SWLj of each set are respectively connected to the rows of memory cells of the associated cluster 21b.

Figure 6:
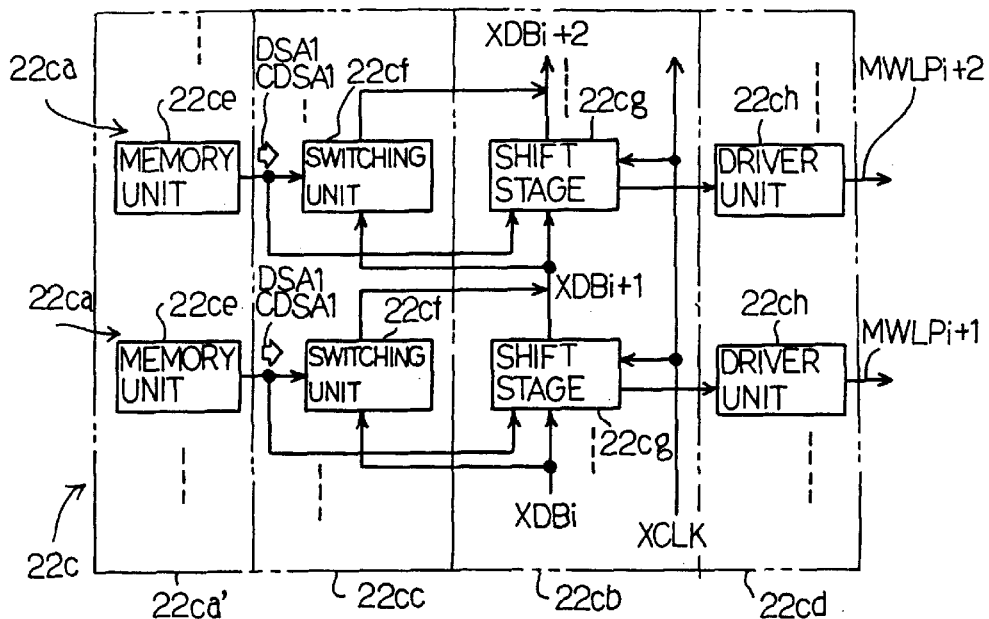
FIG. 6 is a block diagram showing a main word decoder incorporated in the semiconductor memory device.
Figure 7:
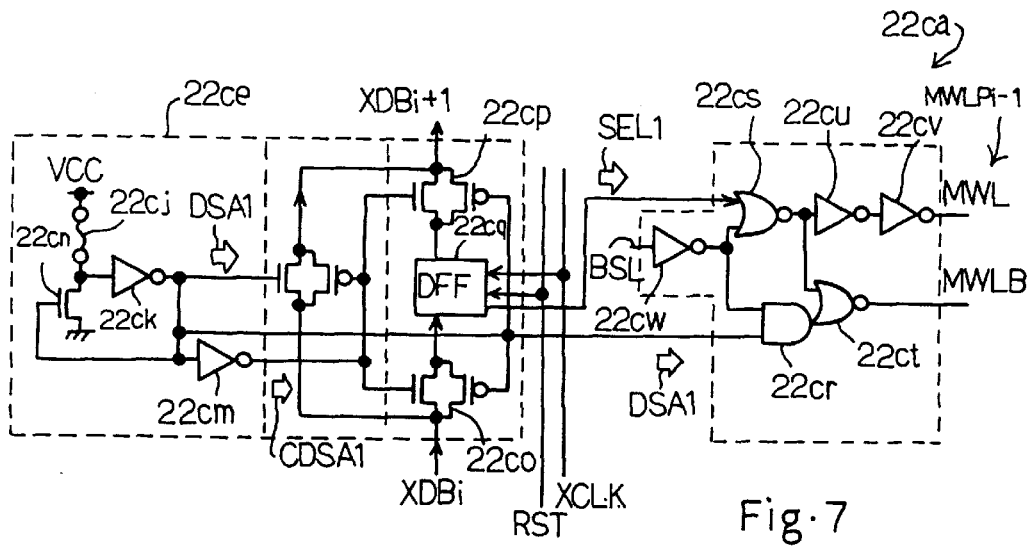
FIG. 7 is a circuit diagram showing a main word decoder circuit forming a part of the main word decoder.

FIGS. 6 illustrates the main word decoder 22c, and FIG. 7 illustrates a main word decoder circuit 22ca forming a part of the main word decoder 22c. In this instance, the main word decoder includes (n+1) main word decoder circuits 22ca.

The main word decoder 22c is broken down into a non-volatile memory circuit 22ca', a shift register 22cb, a bypassing circuit 22cc and a main word line driver 22cd. The bypassing circuit 22cc has (n+1) switching units 22cf, and the shift register 22cb also has (n+1) shift stages 22cg. The main word line driver 22cd also has (n+1) driver units 22ch, and one of the memory units 22ce, one of the switching units 22cf, one of the shift stages 22cg and one of the driver units 22ch as a whole constitute the main word decoder circuit 22ca. The (n+1) memory units 22ce, the (n+1) switching units 22cf, the (n+1) shift stages 22cg and the (n+1) driver units 22ch form the (n+1) main word decoder circuits 22ca. The shift register 22cb and the bypassing circuit 22cc provide a signal propagation path for an activation signal XDBi where i is zero to n in response to a shift clock signal XCLK. When the activation signal is latched by a shift stage 22cg, the shift stage 22cg supplies a cluster selecting signal SEL to the associated driver unit 22ch, and the associated driver unit 22ch changes the associated main word line pair MWLPi active.

Each of the memory units 22ce stores a piece of control data information representative of a defective cluster, and produces a disable signal DSA1 of active high level and the complementary disable signal CDSA1. The disable signal DSA1 and the complementary disable signal CDSA1 are supplied to the associated shift stage 22cg and the associated switching unit 22cf, and make one of the shift stage 22cg and the switching unit 22cf disabled. When the disable signal DSA is active high, the associated switching unit 22cf turns on, and the associated shift stage 22cg is disabled. As a result, the switching unit 22cf forms a part of the signal propagation path for the activation signal XDBi. On the other hand, when the disable signal is inactive low, the associated switching unit 22cf turns off, and the associated shift stage 22cg is enabled. For this reason, the shift stage 22cg latches the activation signal XDBi, and supplies the cluster selecting signal SEL1 to the associated driver unit 22ch.

These components 22ce/22cf/22cg/22ch are detailed with reference to FIG. 7. The memory unit 22ce includes a fuse element 22cj, inverters 22ck 22cm and an n-channel enhancement type switching transistor 22cn. The fuse element 22cj and the n-channel enhancement type switching transistor 22cn are connected in series between a positive power supply line VCC and the ground line, and the drain node of the n-channel enhancement type switching transistor 22cn is connected to the input node of the inverter 22cg. The output node of the inverter 22ck is connected to the gate electrode of the n-channel enhancement type switching transistor 22cn and the input node of the other inverter 22cm. The inverters 22ck/22cm produce the disable signal DSA1 and the complementary disable signal CDSA1 at the output nodes thereof, and the potential level of the disable signal DSA1 is dependent on the fuse element.

When the cluster associated with the main word decoder circuit 22ca was defective, the fuse element 22cj was broken, and the input node of the inverter 22ck is electrically isolated from the positive power supply line VCC. In this situation, the inverter 22ck produces the disable signal DSA1 of the active high level at the output node thereof, and the other inverter 22cm produces the complementary disable signal CDSA1 of the low level. The disable signal DSA1 maintains the n-channel enhancement type switching transistor 22cn in on-state, and the input node of the inverter 22ck is grounded.

On the other hand, when the cluster associated with the main word decoder circuit 22ca was non-defective, the fuse element 22cj remained unbroken, and the input node of the inverter 22ck is electrically connected to the positive power supply line VCC. In this situation, the inverter 22ck produces the disable signal DSA1 of the inactive low level at the output node thereof, and the other inverter 22cm produces the complementary disable signal CDSA1 of the high level. The disable signal DSA1 maintains the n-channel enhancement type switching transistor 22cn in off-state.

The shift stage 22cg comprises two transfer gates 22ca and 22cp and a delayed flip-flop circuit 22cq connected between the transfer gates 22ca and 22cp. Each of the transfer gates 22ca/22cp is implemented by a parallel combination of a p-channel enhancement type switching transistor and an n-channel enhancement type switching transistor, and the disable signal DSA1 and the complementary signal CDSA1 are supplied to the gate electrode of the p-channel enhancement type switching transistor and the gate electrode of the n-channel enhancement type switching transistor. For this reason, when the disable signal DSA1 is in the active high level, the transfer gates 22ca/22cp turn off, and the activation signal XDBi never reaches the delayed flip-flop circuit 22cq. On the other hand, when the disable signal DSA1 is in the inactive low level, the transfer gates 22ca/22cp are turned on, and allow the delayed flip-flop circuit 22cq to store the activation signal XDBi.

The delayed flip-flop circuit 22cq has an input node connected to the transfer gate 22ca, a reset node connected to a reset signal line RST, a clock node connected to the shift clock signal line XCLK, an output node connected to the other transfer gate 22cp and a complementary output node connected to the associated driver unit 22ch. The delayed flip-flop circuit 22cq latches the potential level of the activation signal XDBi at the input node in response to the shift clock XCLK, and supplies the cluster selecting signal SEL1 and the activation signal XDBi+1 to the driver unit 22ch and the next shift stage 22cg.

Figure 2:
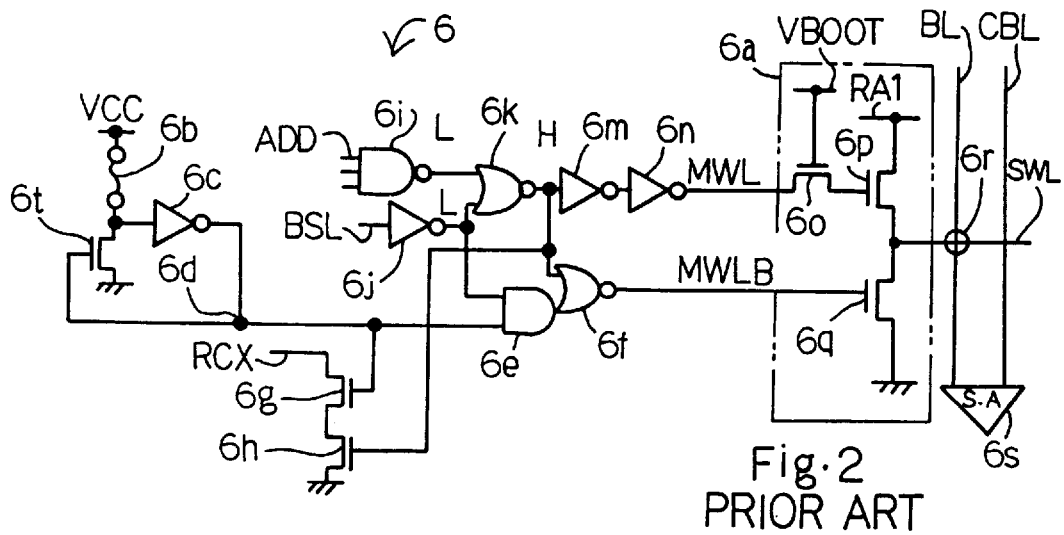
FIG. 2 is a circuit diagram showing the word decoder incorporated in the prior art semiconductor dynamic random access memory device.
Figure 3:
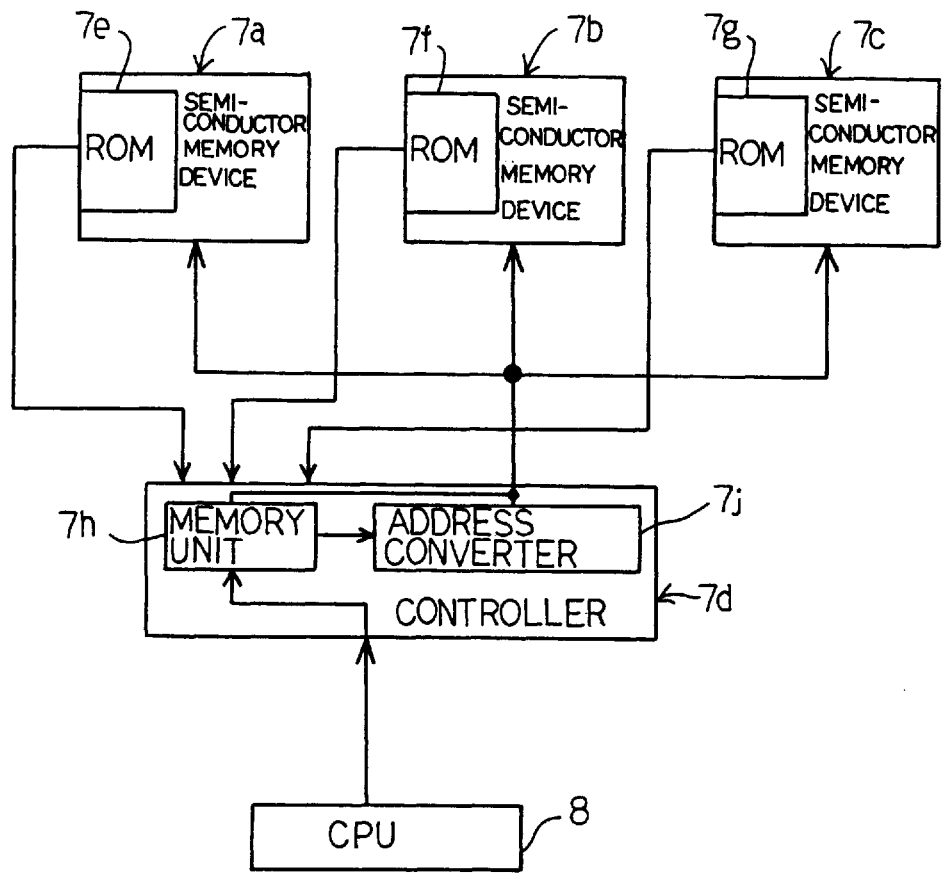
FIG. 3 is a block diagram showing the arrangement of the prior art data file apparatus.
Figure 4:
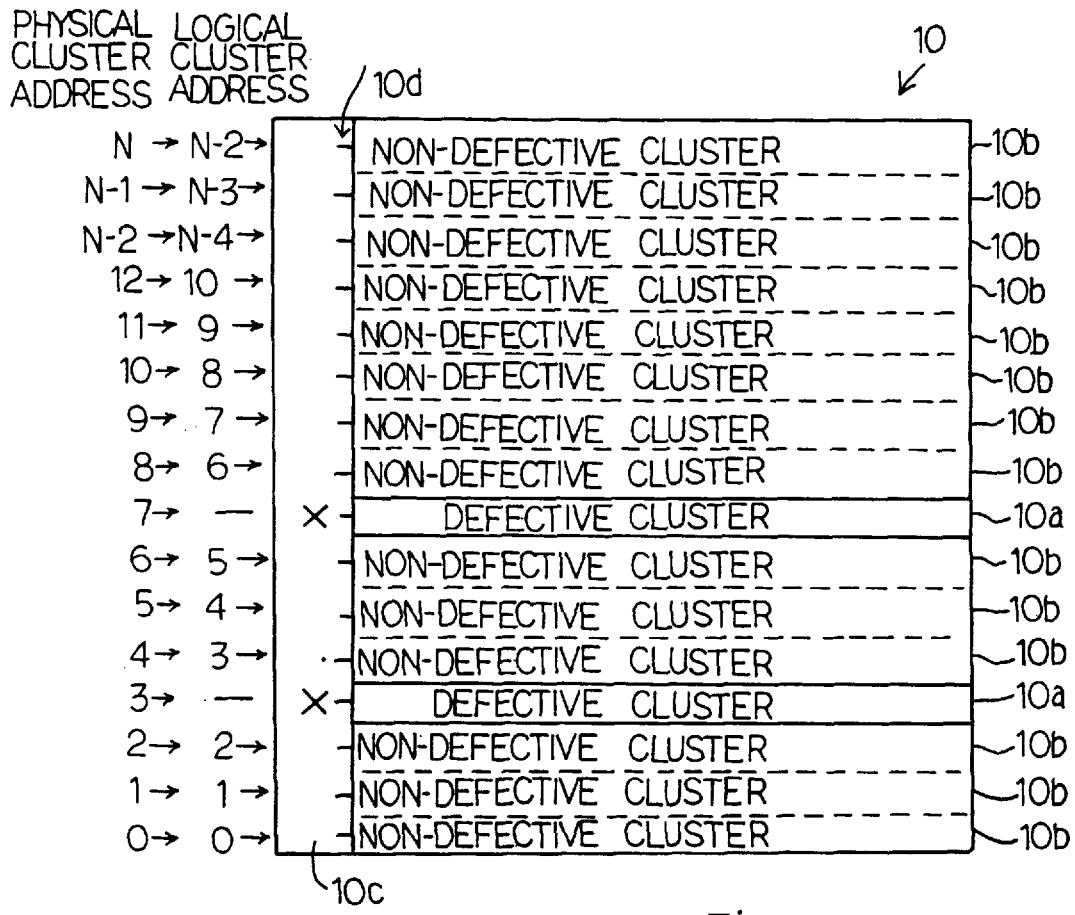
FIG. 4 is a schematic view showing relation between physical cluster addresses of a semiconductor memory device according to the present invention and logical cluster addresses assigned to non-defective clusters.

The driver unit 22ch includes an AND gate 22cr, NOR gates 22cs/22ct and inverters 22cu/22cv. The cluster selecting signal SEL and the disable signal DSA1 are supplied to the NOR gate 22cs and the AND gate 22cr, respectively, and the block selecting signal 22cw is supplied through the inverter 22cw to the NOR gate 22cs and the AND gate 22cr. After the block selecting signal BSL is changed to the high level, the activation signal XDBi is latched by the delayed flip-flop circuit 22cq without the disable signal DSA1 of the active high level. Then, the delayed flip-flop circuit 22cq supplies the selecting signal SEL of the active low level, and the inverter 22cw inverts the block selecting signal BSL to the low level. Then, the NOR gate 22cs yields the output signal of the high level, and inverters 22cu/22cv drive the main word line MWL to a boosted voltage level. The AND gate 22cr produces the output signal of the low level, and the NOR gate 22ct maintains the other main word line MWLB in the low level. The main word lines MWL/MWLB are connected to the associated sub-word decoders 22d similar in circuit configuration to the sub-word decoder 6a (see FIG. 2). If the row address predecoded signals specifies the row address assigned to the sub-word line SWL1, the sub-word decoder 22d drives the sub-word line SWL1 to the boosted voltage level.

Turning back to FIG. 5 of the drawings, the decoder controller 23 includes a clock generator 23a, a counter 23b, a comparator 23c and a test circuit 23d. The clock generator 23a supplies the activation signal XDBO and the shift clock signal XCLK to the first shift stage 22cg of the shift register 22cb and all the shift stages 22cg of the shift register 22cb, respectively, and causes the shift register 23cb to sequentially transfer the activation signal XDBi from the first shift stage to the final shift stage. In this instance, thirty-two clusters form the memory cell block 21a, and, accordingly, the maximum physical cluster address "31" is stored in the address buffer 22a in response to a test signal TEST in a test mode. The comparator 23c compares the maximum physical cluster address "31" with the number of the shift clocks XCLK. When the number of the shift clocks XCLK reaches the maximum physical cluster address "31", the comparator 23c instructs the clock generator 23a to stop the shift clock XCLK through a control line CNT1.

Figure 8:
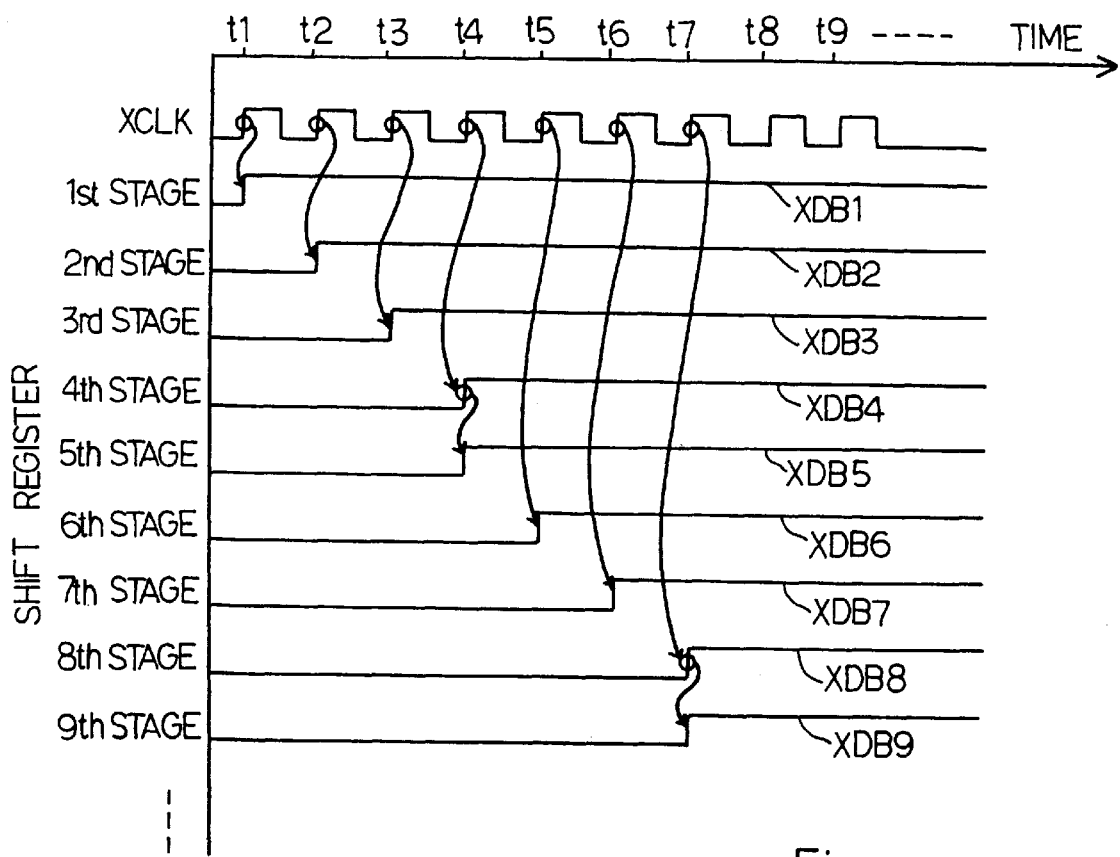
FIG. 8 is a timing chart showing an activation signal transferred from stage to stage.

While the clock generator 23a is supplying the shift clock XCLK to the shift register 22cb, the activation signal XBD0 is transferred from stage to stage as the activation signal XDBi as shown in FIG. 8. The shift clock XCLK is changed from the low level to the high level at times t1, t2, t3, t4, t5, t6, t7, t8, and t9. The first stage 22cg latches the activation signal XDB0 at time t1, and changes the output signal XDB1 to the high level. The second stage 22cg latches the activation signal XDB1 at time t2, and changes the output signal XDB2 to the high level. In this way, the shift stage 22cg associated with the non-defective cluster sequentially transfer the activation signal XDBi to the next shift stage. However, the switching unit 22cf associated with the defective cluster bypasses the activation signal XDBi. In this instance, the clusters associated with the fourth and eighth shift stages are defective, and the activation signals XDB4/XDB5 and XDB8/XDB9 are concurrently produced. If all the clusters were non-defective, the activation signal XDB9 would be produced at time t9. However, the switching units 22cf for the defective clusters accelerate the production of the activation signal XDB9, and the activation signal XDB9 is produced at time t7. The number of the shift clock XCLK between time t7 and time t9 indicates the number of the defective clusters.

The clusters associated with the tenth shift stage to the thirty-second stage are assumed to be non-defective. For this reason, the activation signal XDB32 is supplied to the test circuit 23d at time t30 (see FIG. 5), and the test circuit 23d determines that two defective clusters are incorporated in the memory cell block 21a. The number of defective clusters is stored in the test circuit 23d. Subsequently, the test circuit 23d determines the maximum logical cluster address to be "29", and the maximum logical cluster address is readable from the test circuit 23d by an external device such as a central processing unit (not shown).

Figure 9:
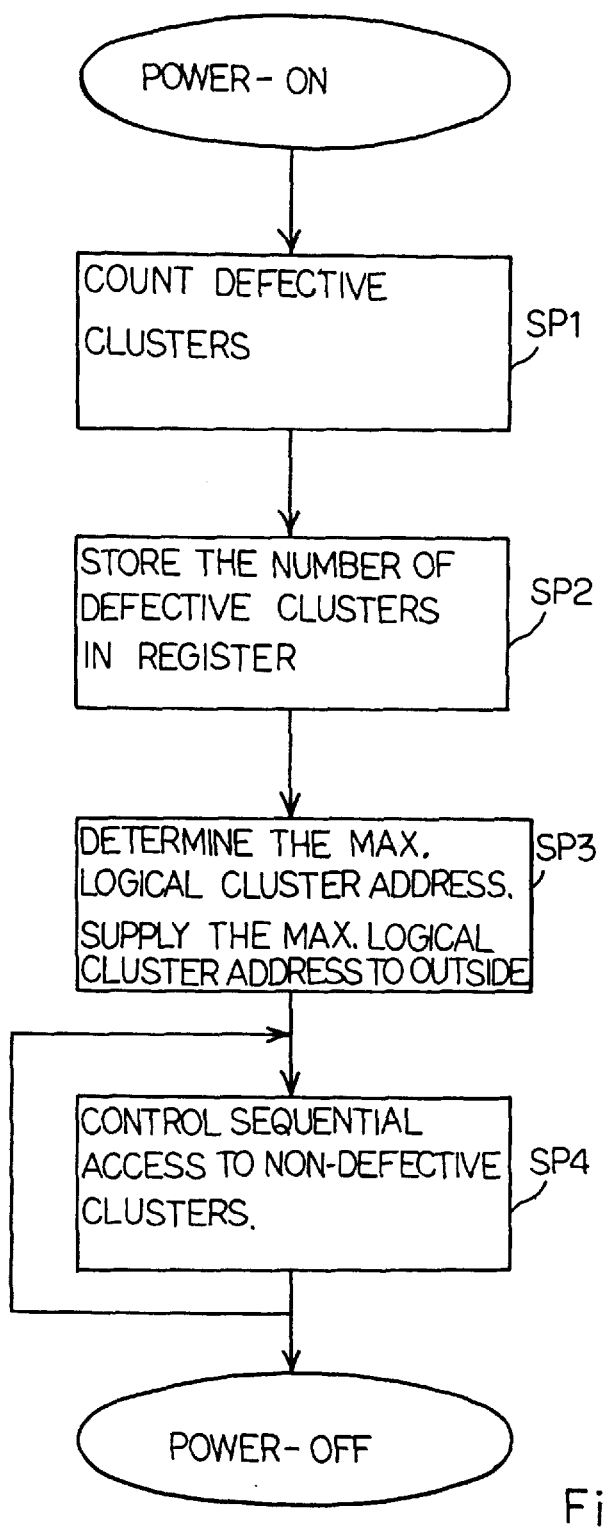
FIG. 9 is a flow chart showing a behavior of a main word line driver and a decoder controller incorporated in the semiconductor memory device.

Thus, the decoder controller 23 checks the main word decoders 22c to see how many clusters are available for the data storage, and stores the number of non-defective clusters. FIG. 9 illustrates the test operation for counting the non-defective clusters described hereinbefore. The test circuit 23d firstly count the defective clusters as by step SP1, and stores the number of defective clusters in a built-in register as by step SP2. Subsequently, the test circuit 23d determines the maximum logical cluster address, and supplies it to the outside of the semiconductor memory device as by step SP3. After the determination of the maximum logical cluster address, when a sequential access is required, the decoder controller 23 supplies the activation signal XDBO and the shift clock XCLK to the main word decoders 22c, and causes the shift register 23cb to transfer the activation signal XDBi from the stage to stage. The switching unit 22cf bypasses the activation signal XDBi, and the defective clusters are never specified. As a result, only the non-defective clusters are sequentially specified so as to read out the data bits from or write data bits into the memory cells of the non-defective clusters as by step SP4. In other words, when the logical cluster addresses are supplied from the outside of the semiconductor memory device, the shift register 22cb and the bypassing circuit 22cc convert the logical cluster addresses to the physical cluster addresses assigned to the non-defective clusters.

The data interface 24 includes a data input/data output circuit 24b connected between the data bus 24a and a data port 24c. The maximum logical cluster address is supplied from the test circuit 23d through the data input/data output circuit 24a to the external device in the test mode. After the test mode, write-in data bits are supplied from the data port 24c through the data input/output circuit 24b to the memory cell array 21, and read-out data bits are transferred from the data bus 24a through the data input/data output circuit 24b to the data port 24c.

In this instance, the shift register 22cb and the bypassing circuit 22cc as a whole constitute an address converter.

As will be appreciated from the foregoing description, the decoder controller supplies the activation signal XDB0 and the shift clock XCLK to the shift register 22cb so as to transfer the activation signal XDBi, and determines the number of defective clusters on the basis of the time lug between the arrival of the activation signal XDBi from the final stage and the expected time. When the number of defective clusters is obtained, the decoder controller 23 determines the maximum logical cluster address, and informs the maximum logical cluster address to the outside thereof.

After the determination of the maximum logical cluster address, the decoder controller 23 supplies the activation signal XDB0 and the shift clock XCLK to the shift register 22cb. The activation signal XDBi is transferred through the shift stages 22cg and the switching units 22cf depending upon the pieces of control data information stored in the memory units 22ce, and the activation signal XDBi causes the shift stages 22cg to selectively enable the driver units 22ch associated with the non-defective clusters. For this reason, only the non-defective clusters are sequentially specified by the main word line pairs MWLP, and the non-defective memory clusters become accessible. The physical cluster address represented by the cluster address predecoded signals is never compared with addresses stored in a file allocation table, and the data access is accelerated. Moreover, the simple memory units 22ce and the address converter are incorporated in the semiconductor memory device, and the production cost is not increased.

Second Embodiment

Figure 10:
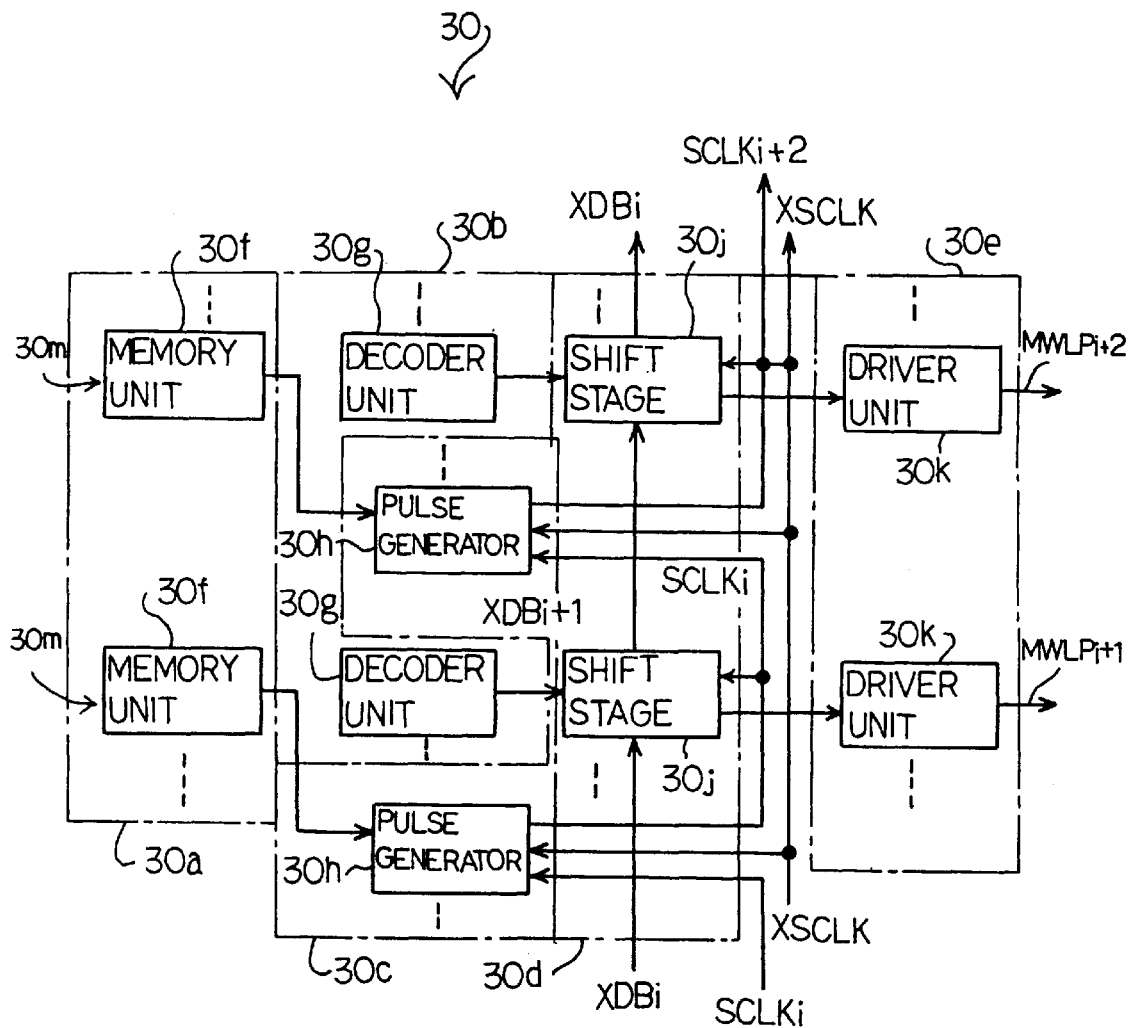
FIG. 10 is a block diagram showing a main word decoder incorporated in another semiconductor memory device according to the present invention.

FIG. 10 illustrates a main word decoder 30 incorporated in another semiconductor memory device embodying the present invention. The semiconductor memory device implementing the second embodiment is similar to the first embodiment except for the main word decoders 30 and a decoder controller 31 shown in FIG. 11. For this reason, description is focused on the main word decoder 30 and the decoder controller 31 for the sake of simplicity. The main word decoder 30 is assumed to select one of (n+1) clusters from the memory cell block 21a.

Figure 12:
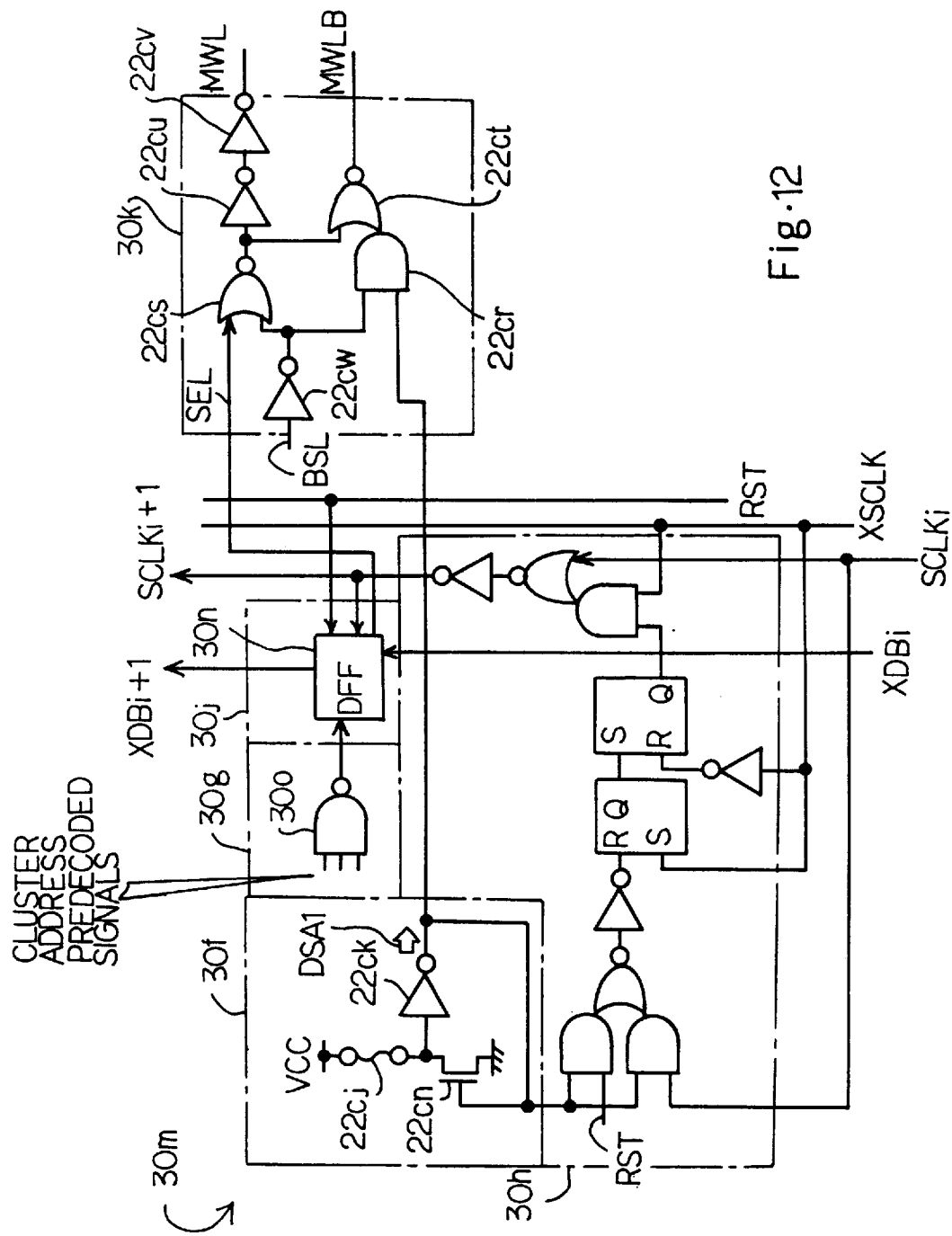
FIG. 12 is a circuit diagram showing the circuit configuration of the main word decoder.

The main word decoder 30 includes a non-volatile memory circuit 30a, an address decoder circuit 30b, a pulse generating circuit 30c, a shift register 30d and a word line driving circuit 30e. The non-volatile memory circuit 30a, the address decoder circuit 30b, the pulse generating circuit 30c, the shift register 30d and the word line driving circuit 30e have (n+1) memory units 30f, (n+1) decoder units 30g, (n+1) pulse generators 30h, (n+1) shift stages 30j and (n+1) driver units 30k, respectively, and each memory unit 30f, each decoder unit 30g, each pulse generator 30h, each shift stage 30j and each driver unit 30k form in combination a main word driving circuit 30m for one of the clusters. The circuit configuration of each main word driving circuit 30m is illustrated in FIG. 12.

The memory unit 30f and the driver unit 30k are similar to the memory unit 22ce and the driver unit 22ch, respectively, and circuit components thereof are labeled with the same references as those designating the circuit components of the memory unit 22ce and the driver unit 22ch.

The shift stage 30j is implemented by a delayed flip flop circuit 30n, only. A NAND gate 30o serves as the decoder unit 30g, and the cluster address predecoded signal is supplied to the input nodes of the NAND gate 30o. When the cluster address predecoded signal specifies the associated cluster, the NAND gate 30o sets the delayed flip flop circuit 30n. The set status is propagated from stage to stage in response to a shift clock SCLKi.

If the fuse element 22cj is unbroken, the memory unit 30f supplies the disable signal DSA1 of the inactive low level to the pulse generator 30h, and the pulse generator produces the shift clock SCLKi+1 from the shift clock SCLKi so as to transfer the shift clock SCLKi+1 to the next pulse generator. Thus, the pulse generator 30h serves as a signal buffer in the absence of the disable signal of the active high level.

On the other hand, if the fuse element 22cj is broken, the pulse generator 30h produces the shift clock SCLKi+1 from a pulse signal XSCLK. The pulse generator 30h produces one pulse in so far as the previous pulse generator does not supply the shift clock SCLKi-1. If the previous pulse generator supplies the shift clock SCLKi-1 to the pulse generator 30h, the pulse generator produces one more pulse.

Figure 11:
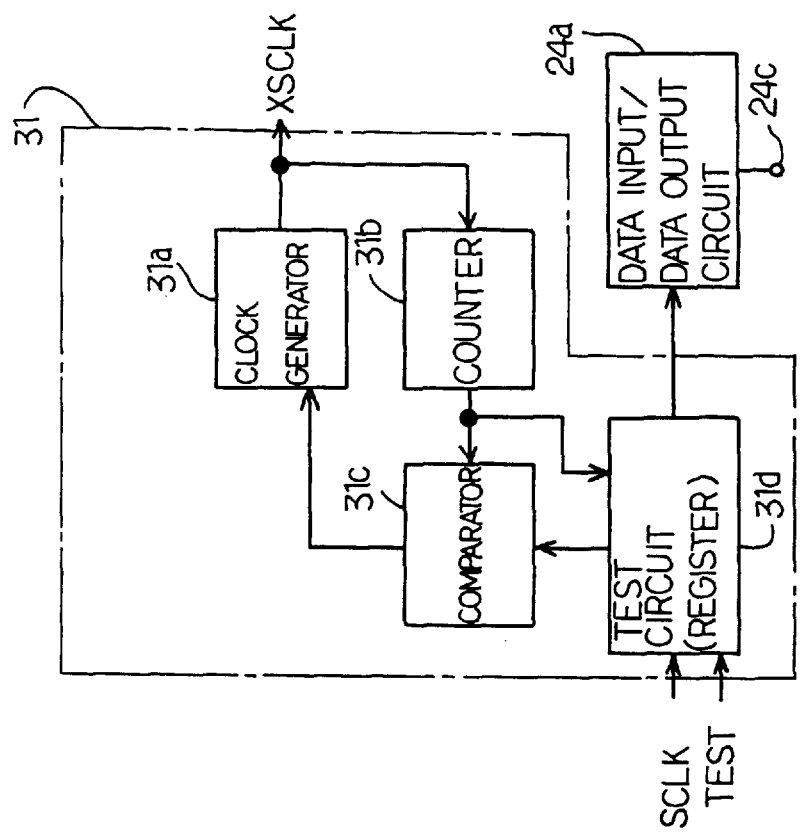
FIG. 11 is a block diagram showing the arrangement of a decoder controller incorporated in the semiconductor memory device.

Turning to FIG. 11 of the drawings, the decoder controller 31 comprises a clock generator 31a, a counter 31b, a comparator 31c and a test circuit 31d. The clock generator produces the clock signal XSCLK, and supplies the clock signal XSCLK to the pulse generators 30h.

Figure 13:
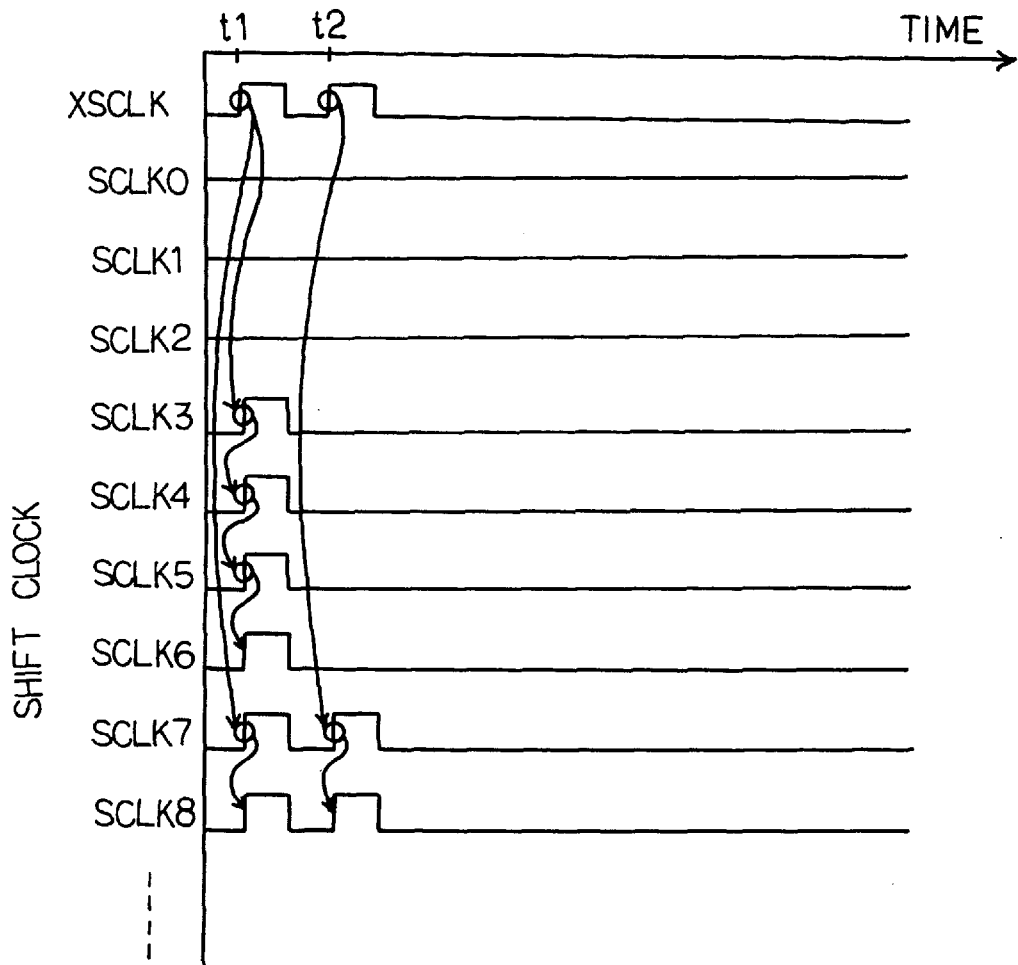
FIG. 13 is a timing chart showing a sequential transfer of an activation signal in a test mode.

The decoder controller 31 cooperates with each main word decoder 30, and determines the maximum logical cluster address as follows. FIG. 13 illustrates a test operation on one of the main word decoders 30 for determining the maximum logical cluster address. In the following description, the main word decoder 30 is associated with thirty-two clusters, and the fourth and eighth clusters are assumed to be defective. The clock generator 31a supplies the clock signal XSCLK to the clock generators 30h at time t1. The first, second and third clock generators 30h maintain the shift clock signal in the low level, because associated memory units 30f keep the disable signals DSA1 inactive low representative of the non-defective clusters. However, the fourth pulse generator 30h produces one-shot pulse due to the disable signal DSA1 of the active high level, and the shift clock signal SCLK3 contains one pulse. The fifth to seventh pulse generators 30h transfer the pulse to the next pulse generator, and each of the shift clock signals SCLK4 to SCLK6 contains one pulse. The eight pulse generator also produces one pulse at time t1 and another pulse at time t2. The two pulses are transferred from the eight pulse generator to the final pulse generator, and return to the test circuit 31d. The test circuit determines that the memory cell block 21a contains two defective clusters, and the maximum logical cluster address is stored in the register of the test circuit 31d. The maximum logical cluster address is read out from the register, and is supplied through the data port 24c to an external device.

As will be appreciated from the foregoing description, the main word decoder internally converts an external logical cluster address to a physical cluster address with the shift clock signal. Any file allocation table is required, and the data access is accelerated. The semiconductor memory device reports only the maximum logical cluster address to the outside thereof, and the defective addresses are never stored in an external memory. For this reason, the semiconductor memory device according to the present invention does not increase the production cost of the electronic system.

Moreover, a series of the logical cluster addresses is assigned to the non-defective clusters, and an external device can successively access the non-defective clusters with the logical cluster address.

Although particular embodiments of the present invention have been shown and described, it will be obvious to those skilled in the art that various changes and modifications may be made without departing from the spirit and scope of the present invention.

For example, if a semiconductor memory device directly selects a word line, the present invention is applied to a row address decoder.

The checking operation for determining the defective cluster may be controlled from the outside of the semiconductor memory device.

What is claimed is:

1. A semiconductor memory device for skipping defective word lines, comprising:

defective word line discriminating means respectively incorporated in row decoders for producing binary signals representative of said defective word lines; and converting means responsive to said binary signals for converting external logical addresses assigned to non-defective word lines to addresses lower than said external logical addresses.

2. A semiconductor memory device comprising a plurality of memory cells divided into a plurality of memory cell groups respectively assigned physical addresses, at least one defective memory cell group being incorporated in said plurality of memory cell groups, a decoder including a plurality of decoder units respectively corresponding to said plurality of memory cell groups, and including a plurality of memory units respectively storing control data information each representative of whether the associated memory cell group is defective or non-defective and producing first control signals representative of said control data information, respectively, a plurality of driver units respectively connected to said plurality of memory cell groups and responsive to second control signals for making non-defective memory cell groups accessible, and an address converter connected between said plurality of memory units and said plurality of driver units, responsive to a third control signal for converting external logical addresses indicative of said non-defective memory cell groups to said physical addresses assigned to said non-defective memory cell groups specified by said first control signals and selectively supplying said second control signals to said plurality of driver units, and a decoder controller supplying said third control signal to said address converter.

3. The semiconductor memory device as set forth in claim 2, in which said address converter includes a plurality of shift stages selectively enabled with said first control signals each representative of the non-defective memory cell group, connected in series for sequentially transferring enabled state in response to said third control signal and connected in parallel to said plurality of driver units for selectively supplying said second control signals thereto, and a plurality of first switching units respectively associated with said plurality of shift stages, respectively connected between input nodes of said associated shift stages and output nodes of said associated shift stages and responsive to said first control signals each representative of the defective memory cell group for providing a bypass to the associated shift stage disabled with the first control signal representative of the defective memory cell group.

4. The semiconductor memory device as set forth in claim 3, in which each of said plurality of shift stages includes a second switching unit connected to the input node and changed between on-state and off-state in response to said associated first control signal, a third switching unit connected to the output node and changed between the on-state and the off-state in response to said associated first control signal, and a bi-stable circuit connected between said second switching unit and said third switching unit and responsive to said third control signal so as to store said enabled state supplied from the previous shift stage through said second switching unit for producing said second control signal.

5. The semiconductor memory device as set forth in claim 2, in which each of said plurality of memory units has a fuse element connected between a first power supply source and a second power supply source and broken or remaining unbroken depending upon the associated memory cell group to be defective or non-defective for producing said first control signal.

6. The semiconductor memory device as set forth in claim 2, in which said decoder controller supplies a test signal representative of said enable state to a first shift stage of said plurality of shift stages so as to transfer said test signal in response to said third control signal through said plurality of shift stages and said plurality of first switching units, and determines the number of the defective memory cell groups on the basis of a difference between an actual time consumed during the transfer of said test signal and an expected time to be consumed if said plurality of memory cell groups are non-defective.

7. The semiconductor memory device as set forth in claim 2, in which said address converter is activated for determining a number of defective memory cell groups in a test operation, and includes a plurality shift stages respectively associated with said plurality of driver units and connected in series for sequentially transferring enable state in response to a shift clock signal, and a plurality of pulse generators respectively connected in series for sequentially transferring said shift clock signal and responsive to said first control signals each representative of said non-defective memory cell group for transferring said shift clock signal and responsive to said first control signals each representative of said defective memory cell group for adding a pulse to said shift clock signal; and said decoder controller counts the pulses of said shift clock signal in said test operation for determining the maximum logical address on the basis of the number of pulses in said shift clock signal.

8. A method for controlling a semiconductor memory device having a plurality of memory cell groups respectively assigned physical addresses, comprising the steps of:

a) counting defective memory cell groups of said plurality of memory cell groups after said semiconductor memory device is powered;

b) determining the maximum logical address assigned to one of non-defective memory cell groups of said plurality of memory cell groups on the basis of the number of defective memory cell groups;

c) supplying control data information representative of said maximum logical address to the outside of said semiconductor memory device; and d) entering into a standard mode where an external device selectively accesses said non-defective memory cell groups with a logical address.

* * * * *

UNITED STATES PATENT AND TRADEMARK OFFICE
CERTIFICATE OF CORRECTION

PATENT NO. : 5,848,021
DATED : December 8, 1998
INVENTOR(S) : Tadahiko SUGIBAYASHI It is certified that error appears in the above-identified patent and that said Letters Patent is hereby corrected as shown below:

Column 9, line 10, delete "XDB0" and insert --XCB0--.

Column 10, line 6, delete "XDB0" and insert --XCB0--.

Signed and Sealed this

Twenty-seventh Day of July, 1999

Attest:

Q. TODD DICKINSON

*Attesting Officer*    *Acting Commissioner of Patents and Trademarks*

UNITED STATES PATENT AND TRADEMARK OFFICE
CERTIFICATE OF CORRECTION

PATENT NO. : 5,848,021
DATED : December 8, 1998
INVENTOR(S) : Tadahiko Sugibayashi It is certified that error appears in the above-identified patent and that said Letters Patent is hereby corrected as shown below:

Column 9, line 10, delete "XCB0" and insert --XDB0--.

Column 10, line 6, delete "XCB0" and insert --XDB0--.

Signed and Sealed this

Twenty-first Day of November, 2000

Attest:

Q. TODD DICKINSON

*Attesting Officer*  *Director of Patents and Trademarks*